(12) United States Patent
Sun et al.

(10) Patent No.: US 11,306,388 B2
(45) Date of Patent: Apr. 19, 2022

(54) SPUTTERING TARGETS AND DEVICES INCLUDING MO, NB, AND TA, AND METHODS

(71) Applicant: H.C. STARCK INC., Newton, MA (US)

(72) Inventors: Shuwei Sun, Framingham, MA (US); Gary Alan Rozak, Akron, OH (US); Qi Zhang, Wellesley, MA (US); Barbara Cox, Norwood, MA (US); Yen-Te Lee, Taipei (TW)

(73) Assignee: H.C. STARCK INC., Newton, MA (US)

(*) Notice: Subject to any disclaimer, the term of this patent is extended or adjusted under 35 U.S.C. 154(b) by 282 days.

(21) Appl. No.: 16/115,648

(22) Filed: Aug. 29, 2018

(65) Prior Publication Data

US 2019/0066987 A1 Feb. 28, 2019

Related U.S. Application Data

(63) Continuation of application No. 14/992,266, filed on Jan. 11, 2016, now abandoned.

(60) Provisional application No. 62/102,333, filed on Jan. 12, 2015.

(51) Int. Cl.
| | |
|---|---|
| *C23C 14/22* | (2006.01) |
| *C23C 14/08* | (2006.01) |
| *C23C 14/14* | (2006.01) |
| *C23C 14/16* | (2006.01) |
| *C23C 14/34* | (2006.01) |
| *C23C 14/58* | (2006.01) |
| *H01J 37/34* | (2006.01) |

(52) U.S. Cl.
CPC ............ *C23C 14/22* (2013.01); *C23C 14/083* (2013.01); *C23C 14/14* (2013.01); *C23C 14/165* (2013.01); *C23C 14/3407* (2013.01); *C23C 14/3414* (2013.01); *C23C 14/5873* (2013.01); *H01J 37/3429* (2013.01); *G06F 2203/04103* (2013.01)

(58) Field of Classification Search
CPC . C23C 14/083; C23C 14/165; C23C 14/3407; C23C 14/3414; C23C 14/14; C23C 14/22; C23C 14/024; C23C 14/025; C23C 14/5873; H01J 37/3429; H01J 37/3426
See application file for complete search history.

(56) References Cited

U.S. PATENT DOCUMENTS

| | | | |
|---|---|---|---|
| 8,344,470 B2* | 1/2013 | Sampsell | G02B 26/001 257/432 |
| 8,922,017 B2* | 12/2014 | Omoto | H01L 27/11521 257/751 |
| 9,945,023 B2* | 4/2018 | Rozak | G06F 3/041 |
| 2012/0003486 A1* | 1/2012 | Rozak | C22C 1/045 428/457 |

\* cited by examiner

*Primary Examiner* — Michael A Band
(74) *Attorney, Agent, or Firm* — Morgan, Lewis & Bockius LLP

(57) ABSTRACT

Sputtering targets including molybdenum, niobium and tantalum are found to be useful for sputtering films for electronic devices. Sputtering targets with about 88 to 97 weight percent molybdenum show improved performance, particularly with respect to etching, such as when simultaneously etching an alloy layer including the Mo, Nb, and Ta, and a metal layer (e.g., an aluminum layer). The targets are particularly useful in manufacturing touch screen devices.

11 Claims, 8 Drawing Sheets

SPUTTERING TARGETS AND DEVICES INCLUDING MO, NB, AND TA, AND METHODS

CLAIM OF PRIORITY

This application is a continuation of U.S. patent application Ser. No. 14/992,266, filed Jan. 11, 2016, which claims the benefit of and priority to U.S. Provisional Patent Application No. 62/102,333, filed Jan. 12, 2015, the entire disclosure of each of which is hereby incorporated herein by reference.

FIELD

The present teachings are directed at sputtering targets including molybdenum, niobium, and tantalum. The present teachings are also directed at devices, such as touch screen devices, including a metal layer and a molybdenum alloy layer, where the molybdenum alloy layer includes molybdenum, tantalum, and niobium. Preferred devices include an oxide layer comprising molybdenum, niobium, and tantalum, generally at the same concentrations as the molybdenum alloy layer.

BACKGROUND

Sputter targets made from a metal such as molybdenum, methods for preparing them, and their use in flat panel displays are described in U.S. Patent Application Publications 2005/0078264A1 by Yoo et al (published Apr. 15, 2005) and 2005/0189401A1 by Butzer et al. (published on Sep. 1, 2005), each of which is incorporated herein by reference in its entirety. Sputter targets containing molybdenum and titanium, methods for preparing them, and their use in flat panel displays are described in U.S. Patent Application Publications 2008/0314737A1 by Gaydos et al. (published on Dec. 25, 2008), 2007/0089984A1 by Gaydos et al. (published on Apr. 26, 2007), and 2007/0251820A1 by Nitta et al. (published on Nov. 1, 2007), each of which is incorporated herein by reference in its entirety. Sputter targets containing molybdenum and a second metal are described in U.S. Patent Application Publication No. 2004/0263055A1 by Chao et al. published on Dec. 30, 2004, 2007/0122649A1 by Lee et al. published on May 31, 2007, and 2005/0230244A1 by Inoue et al. published on Oct. 20, 2005, 2008/0073674A1 by Cho et al. published on Mar. 27, 2008, and 2005/0191202A1 by Iwasaki et al. published on Sep. 1, 2005, each of which is incorporated herein by reference in its entirety. Sputtering targets including Mo, Nb, and Ta are described for example in US Patent Application 2012/0003486 by Rozak et al. (published on Jan. 5, 2012), incorporated herein by reference in its entirety.

Touch sensor device including an output component for generating images and an input component for generating signals related to the location(s) on a surface of the device that is touched are described for example in US Patent Application 2011/0199341 A1 by Reinfried et al. (published on Aug. 18, 2011), incorporated herein by reference in its entirety. Reinfried et al. teaches the use of a layer consisting only of 91-97 atomic percent molybdenum and 3-9 atomic percent tantalum. However, such layers may have unacceptable corrosion resistance, for example after exposure to an etchant, resulting in low reliability (e.g. failure) of the device.

There continues to exist a need for new touch screen devices and materials for producing touch screen devices having one or any combination of the following: good reliability, improved ease of manufacture, improved performance, increased manufacturing processing window, and increased design flexibility.

SUMMARY

The sputter targets, methods, and devices according to the teachings herein provide one or more benefits related to the performance, reliability, ease of manufacture, large processing window, or high design flexibility needed in devices such as touch screen devices using an molybdenum containing alloy including molybdenum, niobium, and tantalum. For example, undercutting during etching of multiple layers including a first layer and a second layer over the first layer may be avoiding so that the first layer is not carved out from under the second layer. As another example, a molybdenum containing alloy layer according to the teachings herein preferably is corrosion resistance and/or the results in a touch screen device having high reliability, even when etched using a variety of different etchants. The molybdenum containing alloy layer preferably has good adhesion to glass, to silicon, or both. The molybdenum containing alloy layer preferably has low optical reflectivity. The molybdenum containing alloy layer preferably has high uniformity of electrical conductivity over the surface of the layer. The molybdenum containing layer preferably has an electrical conductivity desirable for a touch screen device. The molybdenum containing alloy layer preferably can be etched simultaneously with one or more additional layers. The touch screen device preferably includes an alloy layer and a oxide layer both prepared using the same sputtering target.

A sputtering target according to the teachings herein may comprise about 88 atomic percent to about 97 atomic percent molybdenum; about 2 to about 8 atomic percent niobium; and about 0.5 to 5 atomic percent tantalum; wherein the sputtering target is adapted to be employed for forming a thin film layer.

An electronic device according to the teachings herein may comprise a substrate, a first layer including a first metal deposited above the substrate, and a second layer deposited above the substrate, wherein the second layer is an alloy prepared from the sputtering of a target, preferably a target according to the teachings herein, including molybdenum, niobium, and tantalum.

An electronic device according to the teachings herein may comprise a substrate; a first layer including a first metal deposited above the substrate; and a second layer deposited above the substrate, wherein the second layer is an alloy including about 88 atomic percent to about 97 atomic percent molybdenum, about 2 to about 8 atomic percent niobium, and about 0.5 to 5 atomic percent tantalum.

An electronic device according to the teachings herein may comprise a glass substrate; a first layer including 50 atomic percent or more of a first metal deposited above the substrate; and a second layer deposited above the substrate, wherein the second layer is an alloy including 50 atomic percent or more of an alloying metal, wherein the alloying metal is different from the first metal; wherein the first layer and the second layer are adjacent layers (e.g., in contact with each other on a long surface perpendicular to the thickness of the layers); wherein the first layer has a first etch rate, r1 (expressed in nm/min), in a PAN etchant at 25° C. and the second metal layer has a second etch rate, r2 (expressed in nm/min), in a PAN etchant at 25° C., wherein the ratio r1/r2 is from about 0.67 to about 1.5.

A method for manufacturing an electronic device according to the teachings herein may comprise the steps of depositing a first layer over a substrate; sputtering an alloy layer over the substrate, and at least partially etching the first layer and the alloy layer to form an etched component, wherein the first layer and the alloy layer are adjacent layers (e.g., in contact with each other on a long surface perpendicular to the thickness of the layers). The alloy layer preferably incudes an alloy including molybdenum, niobium and tantalum (e.g., an alloy having about 88 to 97 atomic percent molybdenum, about 2 to 8 atomic percent niobium, and about 0.5 to 5 atomic percent tantalum) over the first layer; wherein the first layer and the alloy layer have different conductivities, and wherein the etched component is substantially free of an undercut of the first layer relative to the alloy layer.

A method for manufacturing an electronic device according to the teachings herein may comprise the steps of: depositing a first layer over a substrate; depositing a second layer (e.g., an alloy layer) over the substrate by sputtering a sputtering target including molybdenum, niobium and tantalum according to the teachings herein; and at least partially etching the first layer and the alloy layer to form an etched component. The first layer and the second layer preferably are adjacent layers (e.g., in contact with each other on a long surface perpendicular to the thickness of the layers). The second layer and the first layer preferably have different conductivities.

DETAILED DESCRIPTION

Figure 1:
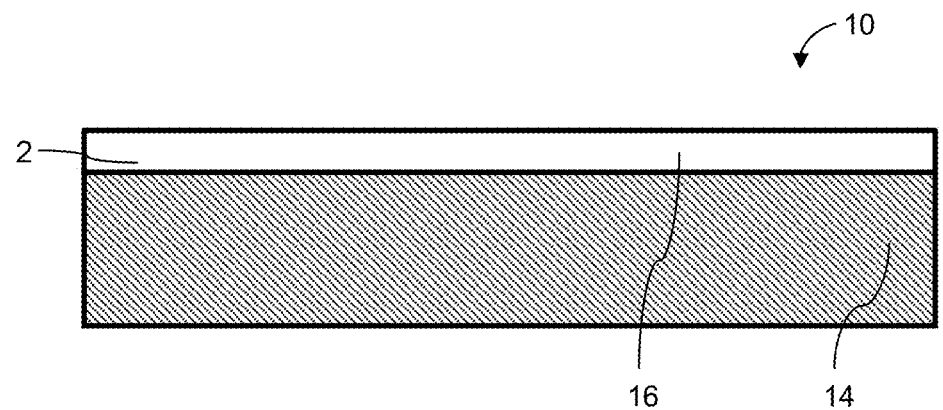
FIG. 1 is a side view drawing showing illustrative features of a substrate having a deposited layer.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description. As used herein, Mo—Nb—Ta and MoNbTa refer to targets or deposited layers that include molybdenum, niobium, and tantalum elements, and does not indicate a relative ratio of the three elements (e.g., does not indicate a ratio of 1:1:1).

An alloy layer according to the teachings herein, including, consisting essentially of, or consisting entirely of molybdenum, niobium, and tantalum, provide one or more benefits related to the performance, reliability, ease of manufacture, large processing window, or high design flexibility needed in devices such as touch screen devices. Such alloy layer(s) may be present as one or more film layers in a touch screen device. An alloy layer may be deposited using a sputtering process, such as a sputtering process according to the teachings herein. An alloy may be deposited using a sputtering target according to the teachings herein including, consisting essentially of, or consisting entirely of molybdenum, niobium, and tantalum.

The sputtering target (e.g., a surface of the sputtering target) and/or an alloy layer of an electronic device preferably includes, consist substantially of, or consists entirely of molybdenum, niobium, and tantalum. The total concentration of molybdenum, niobium, and tantalum atoms preferably is about 95 atomic percent or more, more preferably about 97 atomic percent or more, even more preferably about 99 atomic percent or more, even more preferably about 99.5 atomic percent or more, and most preferably about 99.8 atomic percent or more, based on the total number of metal atoms in the sputtering target and/or the alloy layer. The total concentration of molybdenum, niobium, and tantalum atoms may be about 100 percent or less, about 99.99 percent or less, about 99.95 percent or less, or about 99.90 percent or less, based on the total number of metal atoms in the sputtering target and/or the alloy layer. By way of example, the sputtering target, the alloy layer, or both may have a purity (e.g., total concentration of metal atoms and/or total concentration of Mo, Nb, and Ta) of about 99.9 atomic percent or more, about 99.99 atomic percent or more, about 99.99 atomic percent or more, or about 99.999 atomic percent or more.

A sputtering target according to the teachings herein may be employed for preparing an alloy, for preparing an oxide layer or both. For example, the sputtering target may be employed for preparing an oxide layer including, consisting substantially of, or consisting entirely of molybdenum, niobium, tantalum, and oxygen. The total concentration of molybdenum, niobium, tantalum, and oxygen atoms preferably is about 95 atomic percent or more, more preferably about 97 atomic percent or more, even more preferably about 99 atomic percent or more, even more preferably about 99.5 atomic percent or more, and most preferably about 99.8 atomic percent or more, based on the total number of atoms in the oxide layer. The total concentration of molybdenum, niobium, tantalum, and oxygen atoms may be about 100 percent or less, about 99.99 percent or less, about 99.95 percent or less, or about 99.90 percent or less, based on the total number of atoms in the oxide layer. By way of example, the oxide layer may have a purity (e.g., total concentration of metal atoms and oxygen atoms, and/or total concentration of Mo, Nb, Ta, and O atoms) of about 99.9 atomic percent or more, about 99.99 atomic percent or more, about 99.99 atomic percent or more, or about 99.999 atomic percent or more.

A sputtering target (e.g., the region of a sputtering surface of a sputtering target), an alloy layer, or an oxide layer may optionally include one or more additional metal elements (e.g., a metal element other than Mo, Ta, and Nb). The total concentration of the one or more additional metal elements preferably is about 5 atomic percent or less, more preferably about 3 atomic percent or less, even more preferably about 0.9 atomic or less, even more preferably about 0.4 atomic percent or less, even more preferably about 0.09 atomic percent or less, and most preferably about 0.04 atomic percent or less, based on the total number of atoms in the sputtering target or the layer.

The sputtering target preferably results in a deposited molybdenum containing layer having an etch rate similar to the etch rate of aluminum. For example, the ratio of the etch rate of the molybdenum containing layer to the etch rate of aluminum is about 0.5 or more, preferably about 2/3 or more, more preferably about 0.75 or more, even more preferably about 0.80 or more, even more preferably about 0.85 or more, and most preferably about 0.90 or more. The ratio of the etch rate of the molybdenum containing layer to the etch rate of an aluminum layer may be about 2.0 or less, preferably about 1.75 or less, more preferably about 1.5 or less, even more preferably about 1.3 or less, even more preferably about 1.25 or less, even more preferably about 1.2 or less, even more preferably about 1.10 or less and most preferably about 1.05 or less (e.g., about 1.00 or less). The etch rate ratio may be from about 0.5 to about 2, from about 2/3 to about 1.5, from about 0.75 to about 1.10, or from about 0.80 to about 1.00. The etch rate ratio is measured using the same etchant at the same temperature. Preferably the etch rate ratio is measured using a PAN etchant. More preferably, the etch rate ratio is measured using a PAN etchant having a total concentration of phosphoric acid, acetic acid and nitric acid from about 74 weight percent to about 82.5 weight percent. For example, the etch rate ratio may be measured with a PAN etchant having about 65 weight percent phosphoric acid, about 10 weight percent acetic acid, about 5 weight percent nitric acid, and about 20 weight percent deionized water. As another example, the etch rate ratio may be measured with a PAN etchant having about 72.9 weight percent phosphoric acid, about 4.7 weight percent acetic acid, about 1.4 weight percent nitric acid, and about 21 weight percent deionized water. As another example, the etch rate ratio may be measured with a PAN etchant having about 70 weight percent phosphoric acid, about 10 weight percent acetic acid, about 2.5 weight percent nitric acid, and about 17.5 weight percent deionized water. The etch rate ratio may be measured at an etch temperature from about 20° C. to about 60° C. For example, the etch rate ratio may be measured at 20° C., at 40° C., at 42° C., or at 50° C. Preferably, the etch rate ratio is measured at a temperature of about 42° C.

The concentration of molybdenum in the sputtering target, the alloy layer or the oxide layer preferably is about 88 atomic percent or more, more preferably about 89 atomic percent or more, even more preferably about 90 atomic percent or more, and most preferably about 91 atomic percent or more, based on the total number of atoms in the sputtering target or alloy layer or based on the total number of metal atoms in the oxide layer. The concentration of molybdenum in the sputtering target, the alloy layer or the oxide layer preferably is about 97 atomic percent or less, more preferably about 96 atomic percent or less, even more preferably about 95.5 atomic percent or more, even more preferably about 95.0 atomic percent or less, and most preferably about 94.5 atomic percent or less, based on the total number of atoms in the sputtering target or alloy layer or based on the total number of metal atoms in the oxide layer.

The concentration of niobium in the sputtering target, the alloy layer or the oxide layer preferably is about 2 atomic percent or more, more preferably about 2.8 atomic percent or more, even more preferably about 3.0 atomic percent or more, even more preferably about 3.2 atomic percent or more, and most preferably about 3.4 atomic percent or more, based on the total number of atoms in the sputtering target or alloy layer or based on the total number of metal atoms in the oxide layer. The concentration of niobium in the sputtering target, the alloy layer or the oxide layer preferably is about 8 atomic percent or less, more preferably about 7.6 atomic percent or less, even more preferably about 7.2 atomic percent or more, even more preferably about 6.8 atomic percent or less, and most preferably about 6.4 atomic percent or less, based on the total number of atoms in the sputtering target or alloy layer or based on the total number of metal atoms in the oxide layer.

The concentration of tantalum in the sputtering target, the alloy layer or the oxide layer preferably is about 0.5 atomic percent or more, more preferably about 0.7 atomic percent or more, even more preferably about 0.9 atomic percent or more, even more preferably about 1.1 atomic percent or more, and most preferably about 1.2 atomic percent or more, based on the total number of atoms in the sputtering target or alloy layer or based on the total number of metal atoms in the oxide layer. The concentration of tantalum in the sputtering target, the alloy layer or the oxide layer preferably is about 5 atomic percent or less, more preferably about 4 atomic percent or less, even more preferably about 3.7 atomic percent or more, even more preferably about 3.3 atomic percent or less, even more preferably about 2.9 atomic percent or less, and most preferably about 2.6 atomic percent or less, based on the total number of atoms in the sputtering target or alloy layer or based on the total number of metal atoms in the oxide layer.

The alloy layer preferably is substantially free of oxygen or entirely free of oxygen. For example, the concentration of oxygen in the alloy layer may be about 4 atomic percent or less, about 1 atomic percent or less, about 0.01 atomic percent or less, or about 0.001 atomic percent or less.

It will be appreciated that a sputtering target may have one or more surfaces intended for sputtering. Optionally, a sputtering target may have one or more surfaces that are not intended for sputtering which may be made of the same or a different material as the portions or surfaces of sputtering target intended for sputtering. By way of example, a sputtering target according to the teachings may include one or more backing layers, one or more adhesion layers, or both. Unless otherwise stated, the descriptions of the composition of the sputtering target (whether a mixture, alloy, or otherwise) refers to the surfaces/regions that are intended to be sputtered (i.e., the sputtering region(s) and/or sputtering surface(s) of a sputtering target).

The total concentration of the niobium and tantalum in the sputtering target or the alloy layer may be about 3 atomic percent or more, about 4 atomic percent or more, about 5 atomic percent or more, or about 5.5 atomic percent or more, based on the total number of atoms in the sputtering target or the alloy layer. The total concentration of the niobium and tantalum in the sputtering target or the alloy layer may be about 13 atomic percent or less, about 11 atomic percent or less, about 10 atomic percent or less, about 9 atomic percent or less, or about 8 atomic percent or less, based on the total number of atoms in the sputtering target or the alloy layer.

The total concentration of the niobium and tantalum in the oxide layer may be about 3 atomic percent or more, about 4 atomic percent or more, about 5 atomic percent or more, or about 5.5 atomic percent or more, based on the total number of metal atoms in the oxide layer. The total concentration of the niobium and tantalum in the sputtering target or the alloy layer may be about 13 atomic percent or less, about 11 atomic percent or less, about 10 atomic percent or less, about 9 atomic percent or less, or about 8 atomic percent or less, based on the total number of metal atoms in the oxide layer.

The electronic device may include an alloy layer including Mo, Nb, and Ta (e.g., an alloy layer according to the teachings herein) and an oxide layer including Mo, Nb, Ta, and O (e.g., an oxide layer according to the teachings herein). The alloy layer and the oxide layer preferably have the same atomic ratio of Mo:Nb. The alloy layer and the oxide layer preferably have the same atomic ratio of Mo:Ta. The alloy layer and the oxide layer preferably have the same atomic ratio of Nb:Ta. The alloy layer and the oxide layer may be adjacent layers in contact with each other or may be spaced apart by one or more additional layers. For example, the alloy layer and the oxide layer may be spaced apart by a metal layer, such as a metal layer according to the teachings herein.

The oxide layer may be a capping layer, such as a capping layer directly over a metal layer or a capping layer directly over an alloy layer.

The device preferably includes a first layer arranged over the substrate. The first layer preferably has a sufficiently high electrical conductivity so that it can be used as a conductor. The first layer preferably is a metal layer including one or more metal elements. Preferably the first layer is a layer including or consisting of one or more metal elements selected from the group consisting of Al, Cu, Au, Ag, W, Zn, Ni, Fe, Pt, and Sn. For example, the metal layer may include 50 atomic percent or more, about 60 atomic percent or more, about 70 atomic percent or more, about 80 atomic percent or more, or about 90 atomic percent or more of Al, Cu, Au, Ag, W, Zn, Ni, Fe, Pt, or Sn. The first layer may include or consist essentially of a single metal element. For example, the first metal layer may include a first metal element at a concentration of about 70 atomic percent or more, preferably about 80 atomic percent or more, even more preferably about 90% or more, and most preferably about 95 atomic percent or more. The first metal element preferably is aluminum, copper, gold, silver, tungsten zinc, nickel, platinum, or tin.

Applications

The alloy layer (e.g., the alloy layer including molybdenum, niobium and tantalum) according to the teachings herein may be employed in a touch sensor device including an output component for generating images and an input component for generating signals related to the location(s) on a surface of the device that is touched. The output component may include an optical display, such as a liquid-crystal display. The liquid crystal display may be an active-matrix liquid-crystal display, such as a thin film transistor liquid crystal display. The input component is generally arranged over the output component. Such an arrangement allows a user of the device to touch a position on the surface of the device corresponding to a feature displayed by the output component.

The input component preferably is capable of measuring or otherwise determining the location that the surface is being touched. The input component may sense the location of the touch via resistance sensing, capacitive sensing, optical sensing, electromagnetic induction, acoustic sensing, or any combination thereof. Preferred input components employ resistance sensing and/or capacitive sensing. Preferably the device includes an input component having a plurality of layers including one or more Mo—Nb—Ta alloy layers, such as a Mo—Nb—Ta alloy layer according to the teachings herein. The input component may include one or any combination of the features described in U.S. Pat. No. 8,405,629 B2 (see for example, column 1, line 15 to column 3, line 37, column 5, line 7 to column 7, line 20, and column 7, line 36 to column 9, line 5, incorporated herein by reference). For example the input component may include an indium tin oxide layer, an aluminum zinc oxide layer, an indium zinc oxide layer, or an antimony tin oxide layer. The input device may include a plurality of touch sensor elements (e.g., arranged in a grid or other pattern).

Properties of the Alloy Layer

The alloy layer may have a composition that is the same or different from the composition of the sputtering target according to the teachings herein. Preferably the alloy layer has a composition that is substantially the same as the composition of the sputtering target substantially the same as the composition as the sputtering target (e.g., varying by about 0.5% or less, or about 0.1 or less, in absolute concentration for each of the molybdenum, tantalum, and niobium concentrations).

The alloy layer may have any of the concentrations described herein with respect to the composition of the sputtering target.

The oxide layer (e.g., the capping layer) may have a reflectivity of about 40% or less, about 30% or less, about 25% or less, about 20% or less, or about 18% or less. The oxide layer (e.g., the capping layer) may have a reflectivity of about 0% or more, about 2% or more, about 4% or more, or about 6% or more. For example, the concentration of the Nb, Ta, and oxygen may be sufficiently high so that the oxide layer has a reflectivity of about 25% or less, about 20% or less, or about 18% or less.

The first layer may be sufficiently thick so that it can carry an electric current. Preferably, the first layer has a thickness of about 10 nm or more, more preferably about 25 nm or more, even more preferably about 70 nm or more, even more preferably about 110 nm or more, and most preferably about 150 nm or more. The first layer may be sufficiently thin so that that light transmittance through the first layer is generally high (e.g., about 80% or more, about 90% or more, about 95% or more. or about 99% or more).

Method for Preparing Sputtering Targets

The method for producing the device may include a step of sputtering a molybdenum alloy over a substrate using a molybdenum containing target including molybdenum, niobium, and tantalum (such as a molybdenum containing target having a composition according to the teachings herein) for forming an alloy layer. The method for producing the device may include a step of sputtering an oxide layer over a substrate using a target and introducing oxygen into the sputtering chamber during the deposition of the oxide layer. The alloy layer and the oxide layer may be prepared from the same sputtering target. For example, the alloy layer may be deposited by sputtering a Mo—Nb—Ta containing sputtering target in the absence of oxygen and the oxide layer may be deposited by sputtering the same Mo—Nb—Ta containing sputtering target in the presence of oxygen.

Etching

The process may include one or more steps of etching two or more layers (e.g., two or more adjacent layers) at substantially the same rate. For example, the method may include a step of etching a first layer at a first etch rate, r1, and etching a second layer (e.g., an adjacent layer under the first layer), at a second etch rate, r2, using a common etchant process (including a common etchant and common temperature conditions), wherein the ratio of the first etch rate to the second etch rate, r1/r2 is i) about 0.40 or more, about 0.50 or more, about 2/3 or more, about 0.75 or more, about 0.80 or more, about 0.85 or more, about 0.90 or more, or about 0.95 or more; and/or ii) about 2.50 or less, about 2.00 or less, about 1.7 or less, about 1.5 or less, about 1.4 or less, about 4/3 or less, about 1.25 or less, about 1.20 or less, about 1.15 or less, about 1.10 or less, about 1.05 or less, or about 1.00 or less. The second layer may be etched simultaneously with the first layer for at least a portion of the etching process.

Preferably, the process includes a step of depositing the first metal layer, and a step of depositing the second metal layer.

The etchant may include one or more acids. For example, the etchant may be a PAN etchant including, consisting essentially of, or consisting entirely of phosphoric acid, acetic acid, nitric acid, and water. The concentration of phosphoric acid in the etchant may be about 30 weight % or more, about 40 weight % or more or about 50 weight % or more (e.g., about 60 weight %); and/or about 84 weight % or less, about 78 weight % or less, or about 70 weight % or less, based on the total weight of the etchant. The concentration of acetic acid in the etchant may be about 3 weight % or more, about 8 weight % or more or about 11 weight % or more (e.g., about 15 weight %); and/or about 27 weight % or less, about 22 weight % or less, or about 18 weight % or less, based on the total weight of the etchant. The concentration of nitric acid in the etchant may be about 1 weight % or more, about 3 weight % or more or about 6 weight % or more (e.g., about 7 weight %); and/or about 27 weight % or less, about 15 weight % or less, or about 9 weight % or less, based on the total weight of the etchant. A particularly preferred etchant is a PAN etchant including, consisting essentially, or consisting of i) about 60 weight % phosphoric acid, ii) about 15 weight % acetic acid, iii) about 7 weight % nitric acid, and iv) water, all based on the total weight of the etchant. Another particularly preferred etchant is a PAN etchant including, consisting essentially, or consisting of i) about 65 to about 77 weight % (preferably about 70 to about 73 weight %) phosphoric acid, ii) about 6 to about 12 weight % (preferably about 8.5 to about 9.5 weight %) acetic acid, iii) about 1.0 to about 4.0 weight % (preferably about 1.8 to about 2.5 weight %) nitric acid, and iv) water, all based on the total weight of the etchant. Preferably the water is deionized water. The concentration of water (e.g., added water, such as deionized water) in the PAN etchant preferably is about 10 weight percent or more, more preferably about 15 weight percent or more, even more preferably about 17 weight percent or more, and most preferably about 17.5 weight percent or more, based on the total weight of the PAN etchant. The concentration of water (e.g., added water, such as deionized water) in the PAN etchant preferably is about 40 weight percent or less, more preferably about 30 weight percent or less, even more preferably about 26 weight percent or less, and most preferably about 25 weight percent or less, based on the total weight of the PAN etchant. The total concentration of the phosphoric acid, nitric acid, and acetic acid in the PAN etchant preferably is about 60 weight percent or more, more preferably about 65 weight percent or more, even more preferably about 70 weight percent or more, and most preferably about 74 weight percent or more. The total concentration of the phosphoric acid, nitric acid, and acetic acid in the PAN etchant preferably is about 90 weight percent or less, more preferably about 88 weight percent or less, even more preferably about 85 weight percent or less, even more preferably about 82.5 weight percent or less, and most preferably about 82 weight percent or less.

Although etchants including one or more cyanides (fer example an etchant including or consist essentially of ferricyanide may be employed in etching a molybdenum containing layer, preferably the etchant is substantially free of or entirely free of cyanides.

The method may include a step of simultaneously etching a structure including a layer containing molybdenum, niobium and tantalum, and one or more additional layers. Prior to etching, a pattern may be applied to the surface using a photoresist so that only specific features are etched. As discussed herein, the Mo—Nb—Ta may be part of a structure including one or more additional layers above the Mo—Nb—Ta layer, one or more additional layers below the Mo—Nb—Ta layer, or both. When etching the structure, the etchant may initially etch an uppermost layer (i.e., a surface layer) and then etch one or more additional layers while continuing to etch the uppermost layer. For example, when etching a structure including a Mo—Nb—Ta surface layer, the etchant may first remove a region of the surface layer so that a portion of the layer below the Mo—Nb—Ta surface layer is exposed. Etching of the exposed regions may then proceed.

After etching a plurality of layers including an alloy layer and/or an oxide layer, the structure of the plurality of etched layers preferably is free of an undercut.

The alloy layer preferably has one or more of the following properties: adhesion to glass is about 4B or more (e.g., about 4B to about 5B); adhesion to silicon is about 4B or more (e.g., about 4B to about 5B); corrosion resistance as characterized by less than about 10%, less than about 5%, or less than about 1% increase in electrical resistivity of the film after exposure to high temperature and humidity (e.g. 60° C., 80% humidity, 4 weeks); corrosion resistance as characterized by a slope of electrical conductivity versus day of about 0.0010 Ω/sq/day or less, about 0.0003 Ω/sq/day or less, about 0.00025 Ω/sq/day or less, about 0.00020 Ω/sq/day or less, or about 0.00015 Ω/sq/day or less after exposure at 60° C./80% humidity for 38 days (with measurements take at least once every 7 days); an etch rate compatible with the etch rate of aluminum (e.g., so that undercutting and/or other etch defects are prevented); a reflectivity of about 60 to about 90% over the range of wavelengths from 400 to 800nm; an electrical conductivity less than 30 µΩ·cm (preferably less than 20 µΩ·cm, and more preferably less than 15 µΩ·cm); an electrical resistivity greater than about 5 µΩ·cm (preferably greater than about 10 µΩ·cm; or a uniformity of electrical conductivity less than about 10% (preferably less than about 5%).

The alloy layer preferably has an etch rate ratio (e.g., relative to the etch rate of aluminum) at 42° C., with an PAN etchant (e.g., 70 wt. % phosphoric acid, 10 wt. % acetic acid, 2.5 wt. % nitric acid, and 17.5 wt. % deionized water) of 0.7 or more (preferably 0.8 or more) and 2 or less (preferably 1.6 or less).

The device according to the teachings herein may include a substrate layer 14 and a first layer 2 over the substrate layer 14, such as illustrated in FIG. 1 showing illustrative features of a multi-layered device 10. The first layer 2 preferably is a deposited layer. The first layer 2 may be an alloy layer 16 including or consisting of molybdenum, tantalum, and niobium. Preferably the alloy layer 16 is a layer including or consisting of a Mo—Ta—Nb alloy having a composition according to the teachings herein. For example, the first layer 2 may be a layer deposited from a sputtering target including molybdenum, tantalum, and niobium.

Figure 2:
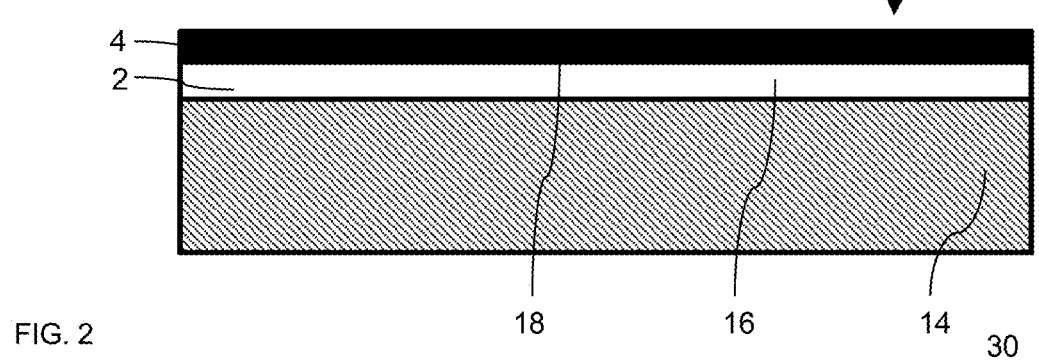
FIG. 2 is a side view drawing showing illustrative features of a structure including a substrate, a first layer, and a second layer.

It will be appreciated that the multi-layered device according to the teachings herein may include additional layers, such as one, two, or more layers between the substrate layer and the first layer, and/or one, two, or more layers over the first layer, such as illustrated in FIG. 2. FIG. 2 is a side view showing illustrative features of a multi-layered device 20 including a substrate layer 14, a first layer 2 over the substrate layer 14 and a second layer 4 over the first layer 2. The first layer 2 and the second layer 4 preferably are deposited layers. The first layer 2 may be an alloy layer 16 including or consisting of molybdenum, tantalum, and niobium. Preferably the alloy layer is a Mo—Ta—Nb layer having a composition according to the teachings herein. For example, the first layer may be a layer deposited from a sputtering target including molybdenum, tantalum, and niobium. Preferably the second layer is a metal layer 18, such as a metal layer according to the teachings herein. For example, the metal layer may be a layer including, consisting primarily of (e.g., about 51 atomic percent or more, or about 80 weight percent or more), or consisting entirely of a metal selected from the group consisting of Al, Fe, Cu, Ag, Au, W, Zn, Pt and Sn. The alloy layer 16 may be interposed between the metal layer 18 and the substrate layer 14. It will be appreciated according to the teachings herein that the alloy 16 may be deposited over the metal layer 18. For example, the metal layer 18 may be interposed between the substrate layer 14 and the alloy layer 16. With reference to FIG. 2, the alloy layer 16 may contact some or all of a large surface of the metal layer 18.

Figure 3A:
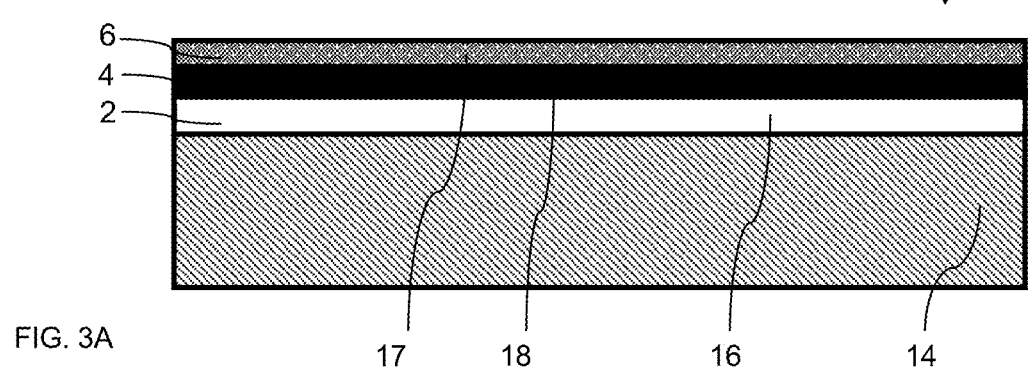
FIG. 3A is a side view drawing showing illustrative features of a structure including a substrate, a first layer, a second layer, and a third layer.
Figure 3B:
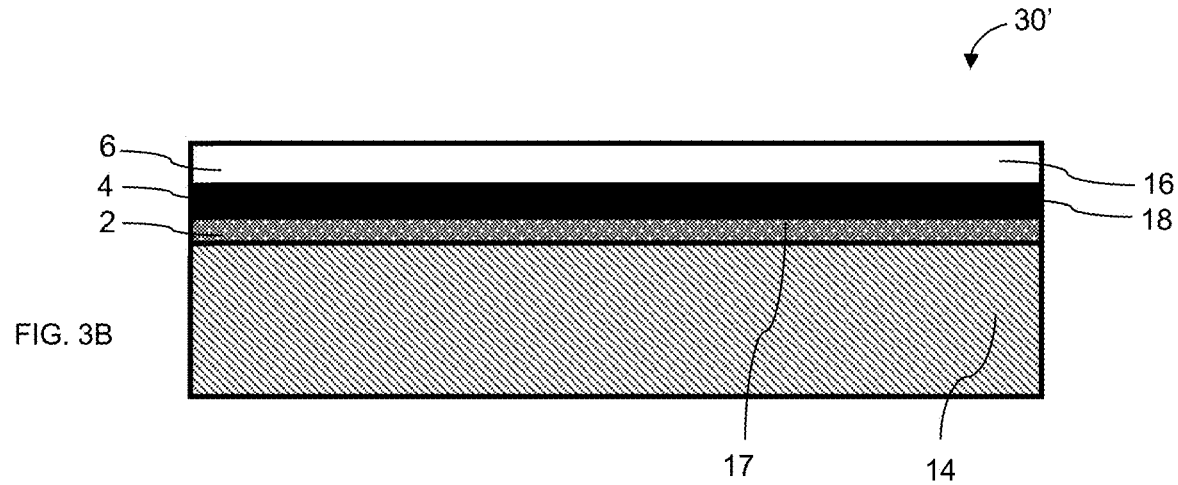
FIG. 3B is a side view drawing showing illustrative features of another structure including a substrate, a first layer, a second layer, and a third layer.

The multi-layer device according to the teachings herein may include an oxide layer, such as illustrated in FIG. 3A and FIG. 3B. FIG. 3A is a side view showing illustrative features of a multi-layered device 30 including a substrate layer 14, a first layer 2 over the substrate layer 14, a second layer 4 over the first layer 2, and a third layer 6 over the second layer 4. The first layer 2 and the second layer 4 preferably are deposited layers. The third layer 6 may be an oxide layer 17 including, consisting essentially of, or consisting entirely of molybdenum, tantalum, niobium, and oxygen. Preferably the oxide layer is a Mo—Ta—Nb—O layer having a composition according to the teachings herein. For example, the third layer may be a layer deposited from a sputtering target including molybdenum, tantalum, and niobium (e.g., by sputtering in the presence of oxygen). Preferably the oxide layer 17 is deposited from the same sputtering target employed in depositing the alloy layer 2. It will be appreciated according to the teachings herein, that the order of depositing the alloy layer 16, the metal layer 18, and the oxide layer 17 may be changed (see for example the multi-layered device 30' of FIG. 3B). Indeed, as the etch rates of two layers may be more closely matched, there may be increased design flexibility in selecting the order of layers to be deposited.

Figure 4:
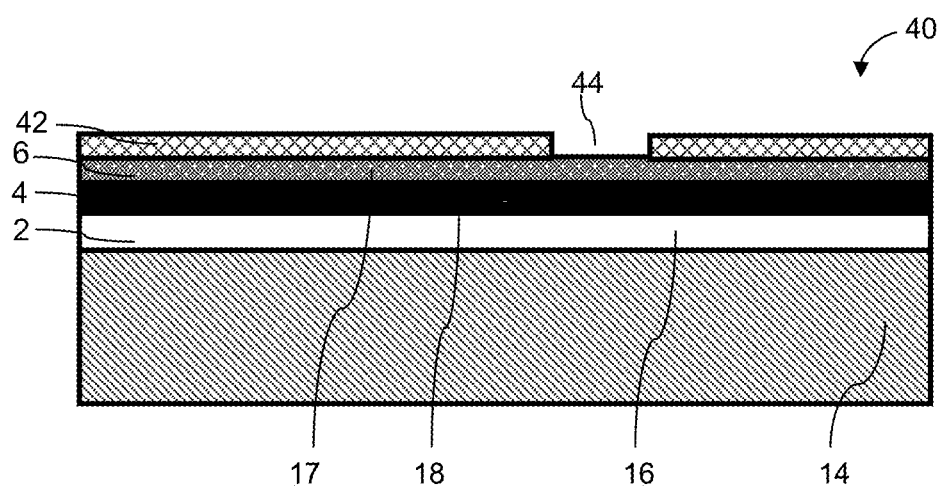
FIG. 4 is a cross-sectional view illustrating features of an electronic device during the manufacture of the device including a pattern in a photoresist.
Figure 5:
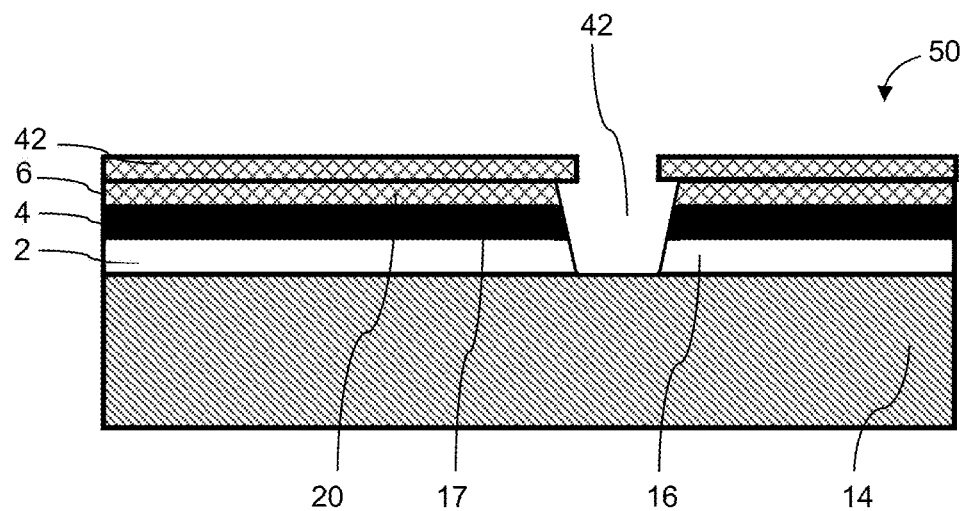
FIG. 5 is a cross-sectional view illustrating features of an electronic device during the manufacture of the device including etching of a plurality of deposited layers.

The multi-layer device may be prepared using a photoresist layer, such as illustrated in FIGS. 4 and 5. For example, a photoresist layer 42 may be deposited over an entire surface and then preferentially removed at one or more etch locations 44, as shown in FIG. 4 to create openings that expose regions of the layer under the photoresist layer. The photoresist may be deposited over an alloy layer, a metal layer, or an oxide layer. After etching the multi-layered structure of FIG. 4, one or more of the layers below the photoresist layer may be removed in the regions below the openings in the photoresist layer, such as illustrated in FIG. 5. For example a portion of the alloy layer, or a portion of the metal layer, or a portion of the oxide layer may be removed by an etchant. A step of etching may remove portions of one or more layers, two or more layers, or three or more layers.

Figure 6:
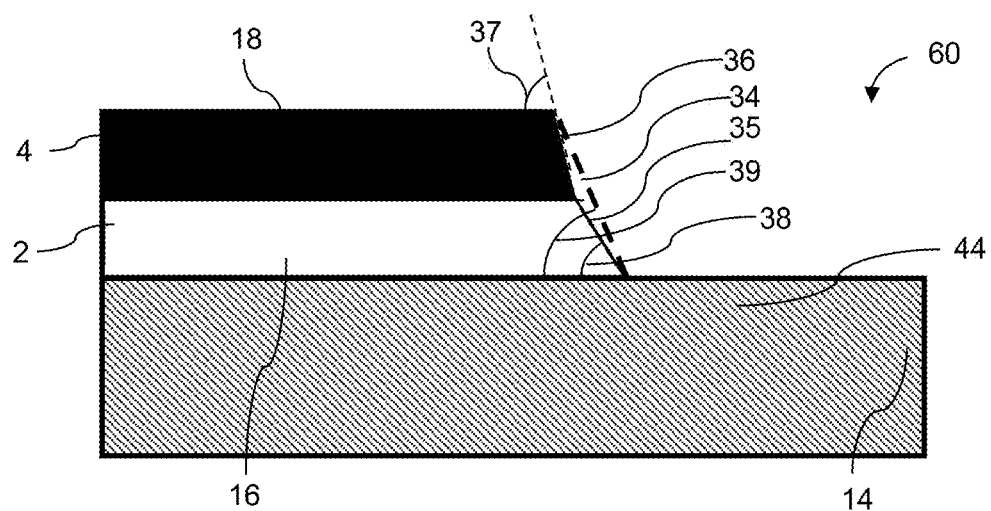
FIG. 6 is a side view drawing illustrating a first etched layer and a second etched layer.
Figure 7:
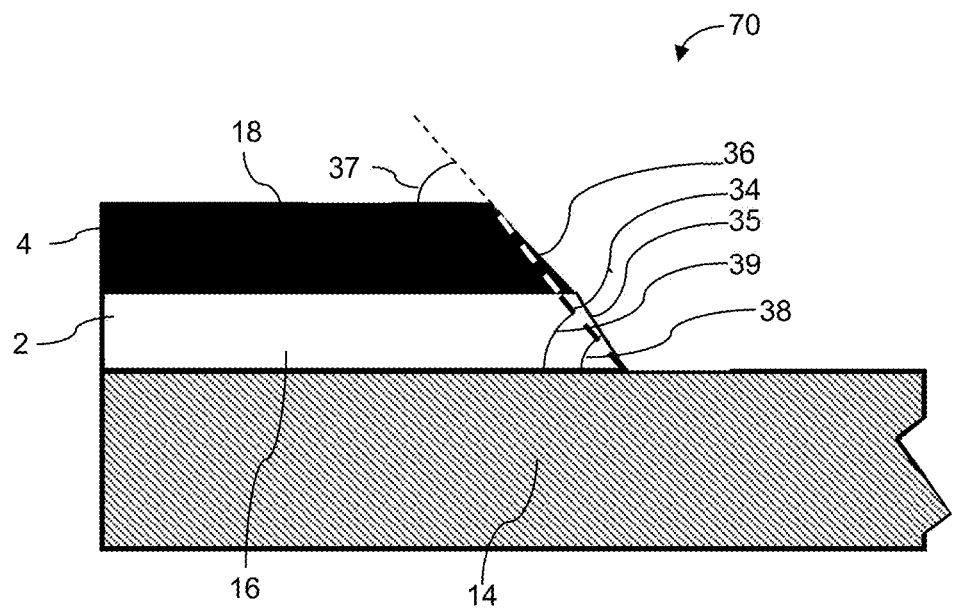
FIG. 7 is another side view drawing illustrating a first etched layer and a second etched layer.
Figure 8:
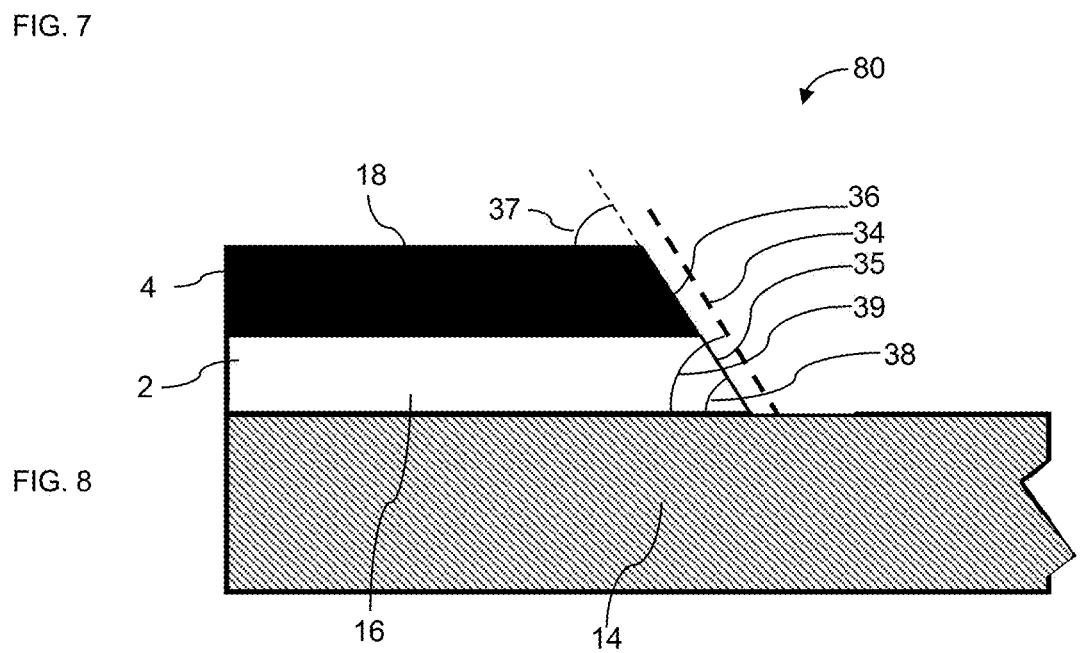
FIG. 8 is another side view drawing illustrating a first etched layer and a second etched layer.

The etching of a multi-layered structure may be characterized by one or more etch angles, such as illustrated in FIGS. 6, 7, and 8. For example, the etchant may remove portions of a second layer 4 and portions of a first layer 2 below and in contact with the second layer 4. The etching may be characterized by an overall etch line 34 which is angled at an overall etch angle 39. The etching of the first layer may be characterized by an etch edge 35 having an etch angle 38. The etching of the second layer may be characterized by an etch edge 36 and an etch angle 37. The etch angles generally is the acute angle of an etch line/edge with the plane of the top surface of the substrate layer 14. The etch angle of the second layer may be greater than the etch angle of the first layer, such as illustrated in FIG. 6. A second layer having an etch angle greater than the etch angle of a first layer may be observed when the etch rate of the second layer 4 is greater than the etch rate of the first layer 2. The etch angle of the first layer 2 may be greater than the etch angle of the second layer 4, such as illustrated in FIG. 7. A first layer having an etch angle greater than the etch angle of a second layer may be observed when the etch rate of the first layer 2 is greater than the etch rate of the second layer 4. The etch angle of the first layer 2 and the etch angle of the second layer 4 may be about the same, such as illustrated in FIG. 8. A first layer having an etch angle about equal to the etch angle of a second layer may be observed when the etch rate of the first layer 2 is equal to the etch rate of the second layer 4.

Figure 9:
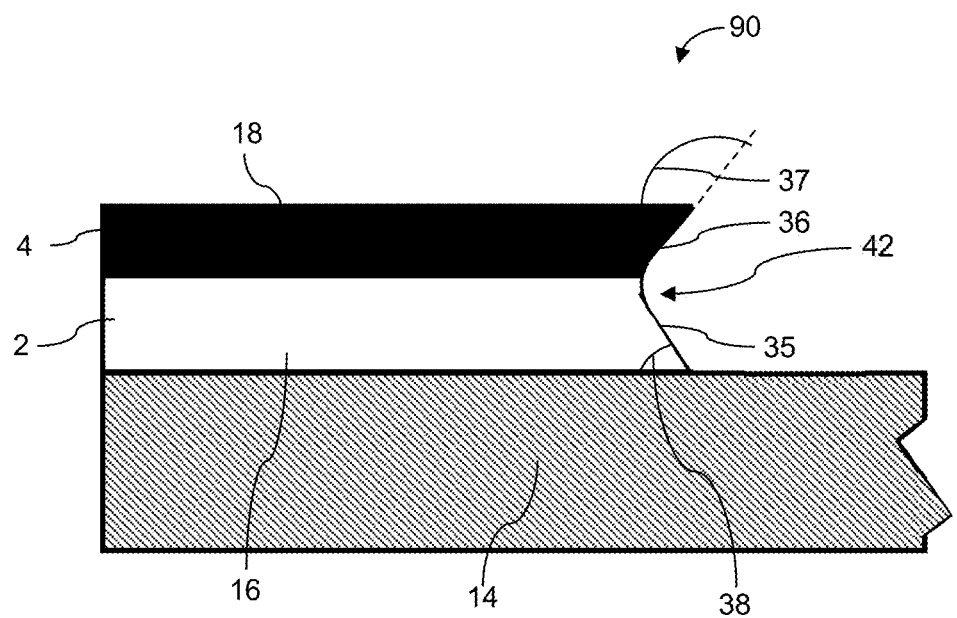
FIG. 9 is a side view drawing Illustrating an undercut that may occur during etching.

The differences in the etch rates of the first layer and the second layer may result in an undercut region, such as illustrated in FIG. 9.

Figure 10:
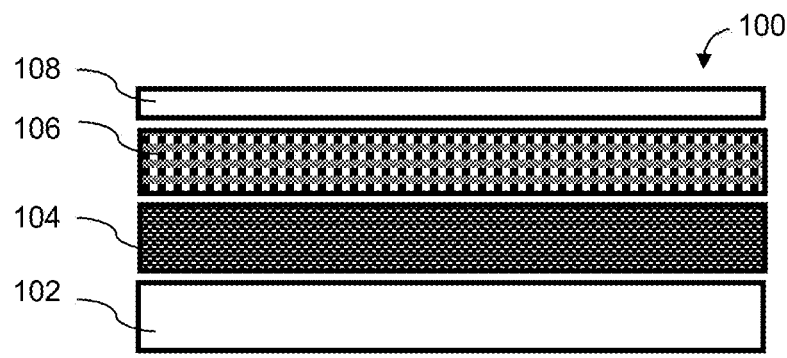
FIG. 10 is a cross-sectional drawing of showing illustrative features of a touch screen device. Two or more adjacent components may be in contact with each other or may include one or more additional layers or other structures between the adjacent components.

The multi-layered devices according to the teachings herein may be employed in a touch screen device. With reference to FIG. 10, the touch screen device 100 may include a substrate 102. Over the substrate 102, the touch screen device 100 may have an output component 104 (e.g., a display) and an input component 106 (e.g., including touch or position sensors). The output component may be over the input component. Preferably the input component is over the output component. The touch screen device preferably includes a cover component 108 (e.g., a glass cover, or transparent polymeric cover), preferably over the input component. The substrate may contact directly with the input component or the output component, or may be separated by one or more additional layers or components. The input component may directly contact the output component, or the two components may be separated by one or more additional layers or components. The cover component may directly contact the input component or the output component, or may be separated by one or more additional layers or components.

Figure 11A:
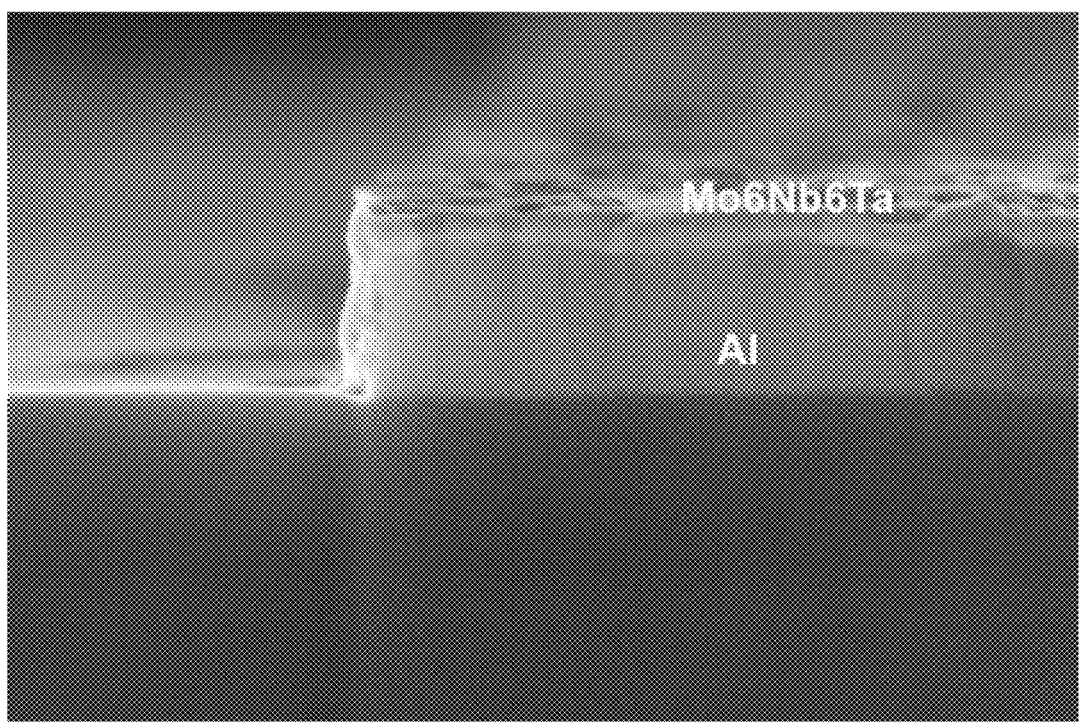
FIG. 11A is a micrograph of an illustrative multi-layer structure after etching in a first etchant solution. The structure includes a substrate, an aluminum layer and an alloy layer.
Figure 11B:
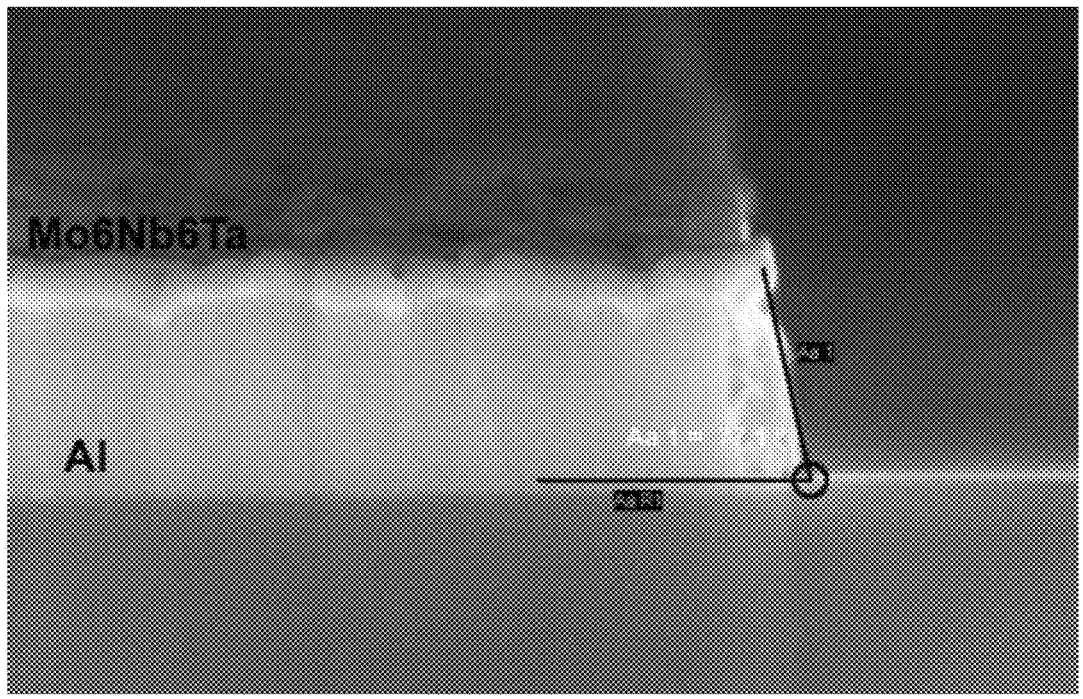
FIG. 11B is a micrograph of an illustrative multi-layer structure after etching in a different etchant solution. The structure includes a substrate, an aluminum layer and an alloy layer.

The etching of a structure including an aluminum layer between a substrate layer and a Mo—Nb—Ta alloy layer is shown in FIGS. 11A and 11B. The aluminum layer is deposited on the substrate. The Mo—Ta—Nb includes about 6 weight percent tantalum, about 6 weight percent niobium, and the remainder is molybdenum (purity of about 99.999 wt. % or more). FIG. 11A shows the structure after etching at room temperature in a PAN etchant having 70 weight % phosphoric acid, 10 weight % acetic acid, and 5 weight percent nitric acid. FIG. 11B. is a micrograph showing the edge surface after etching at room temperature in a PAN etchant having 70 weight % phosphoric acid, 10 weight % acetic acid, and 7 weight percent nitric acid.

Figure 12:
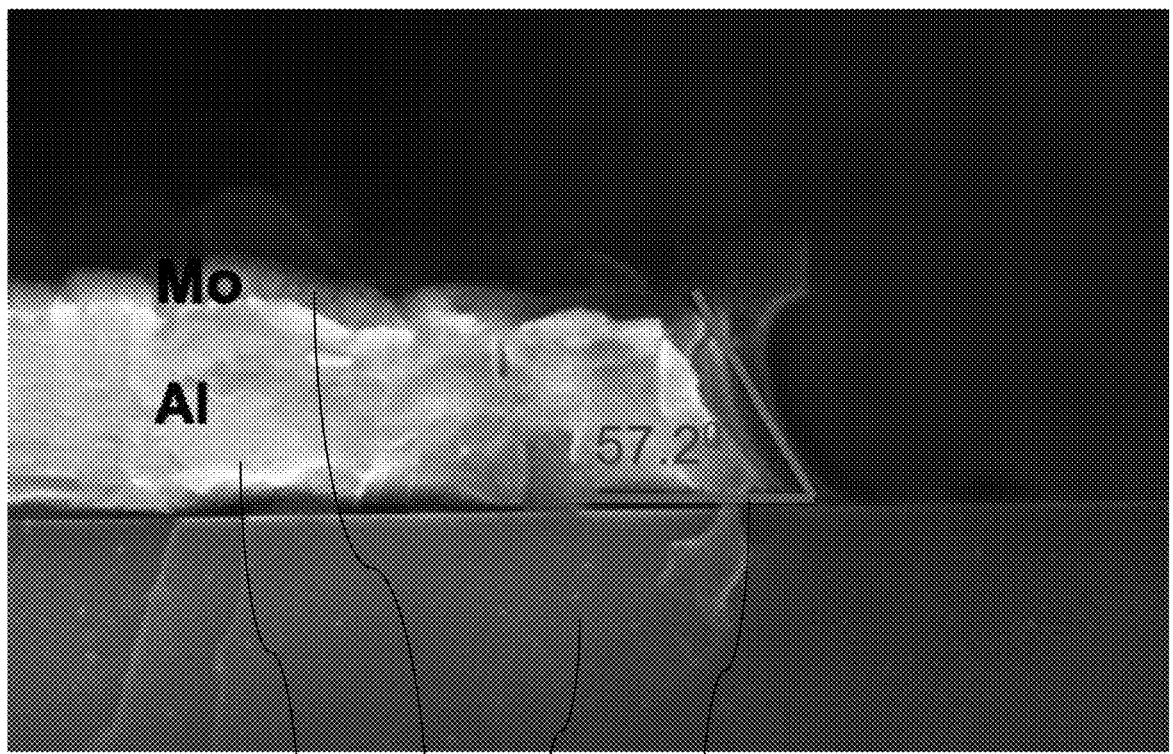
FIG. 12 is a micrograph of another illustrative multi-layer structure after etching. The structure includes a substrate, an aluminum layer and a molybdenum layer.

The overall etch angle may be less than 60°, such as illustrated in FIG. 12. FIG. 12 illustrates a multilayered structure including a layer of aluminum deposited on a substrate and a layer of molybdenum deposited over the aluminum. After etching, an etch angle of about 57° is observed.

Figure 13A:
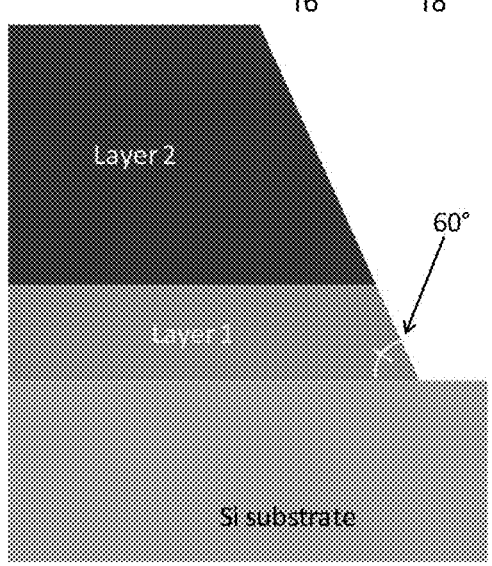
FIG. 13A is an illustrative side view of a multi-layered structure after etching.
Figure 13B:
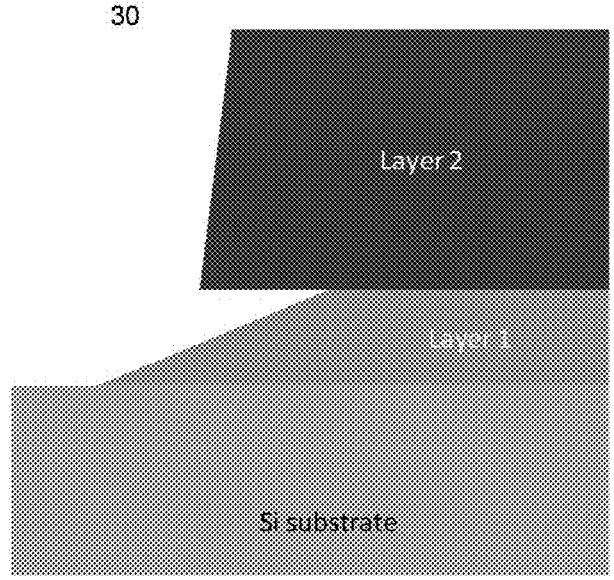
FIG. 13B is an illustrative side view of a multi-layered structure after etching.

After etching, a first layer and a second layer may have about the same etch angle (e.g., about 60°, such as illustrated in FIG. 13A. After etching, an undercut etching of the first layer may occur so that a portion of the second layerhangs the first layer or extends beyond the first layer, such as illustrated in FIG. 13B.

Figure 14:
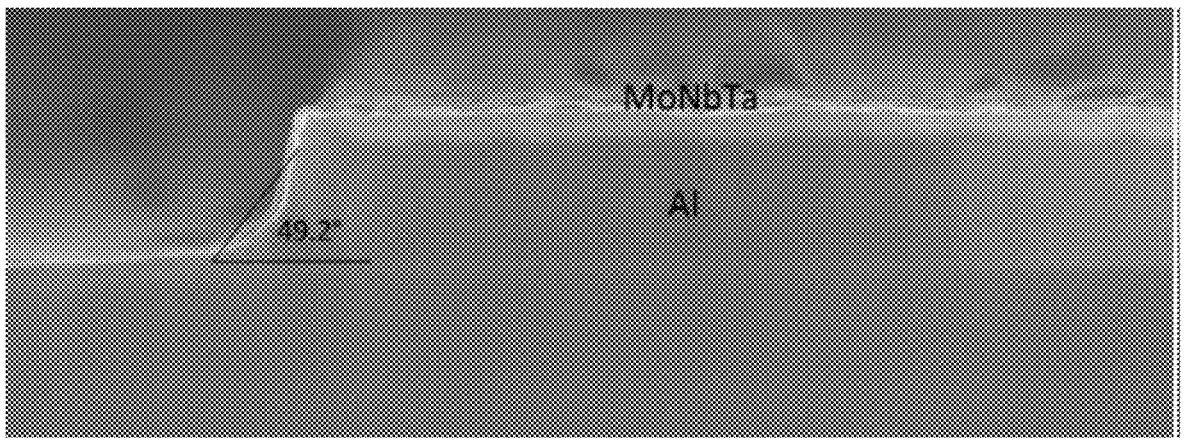
FIG. 14 is a perspective view showing the side of a multi-layered structure with a Mo (93 weight percent)—Niobium (5 weight percent)—Tantalum (2 weight percent) alloy layer of 20 nm deposited over a 250 nm thick aluminum layer, after etching in a mixture of phosphoric acid, acetic acid, nitric acid, and de-ionized water.
Figure 15:
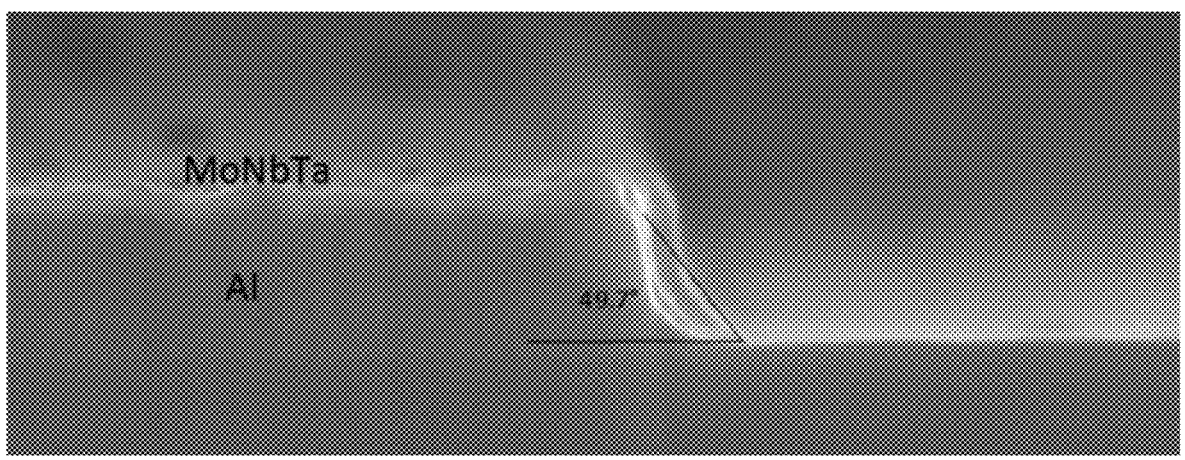
FIG. 15 is a perspective view showing the side of a multi-layered structure with a Mo (92 weight percent)—Niobium (6 weight percent)—Tantalum (2 weight percent) alloy layer of 20 nm deposited over a 250 nm thick aluminum layer, after etching in a mixture of phosphoric acid, acetic acid, nitric acid, and de-ionized water.
Figure 16:
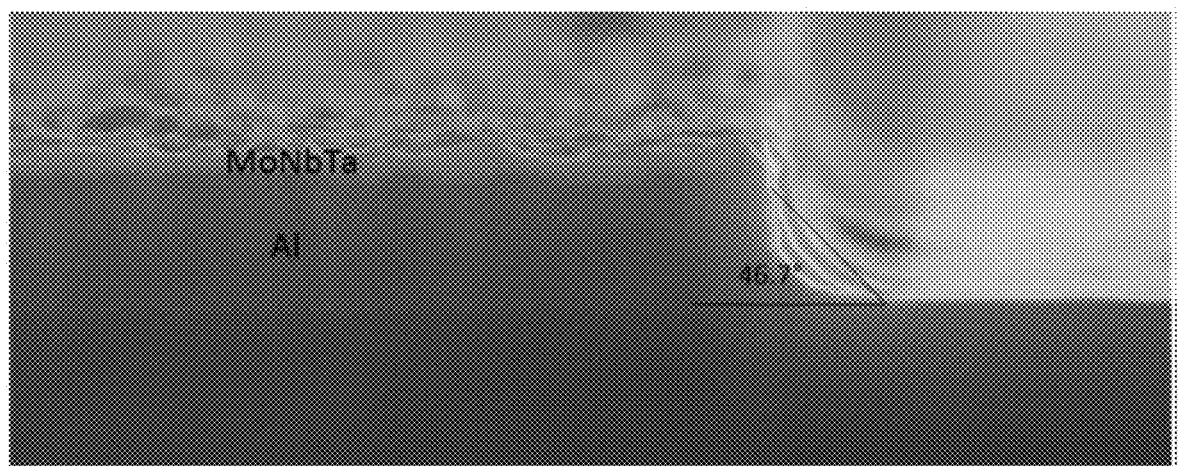
FIG. 16 is a perspective view showing the side of a multi-layered structure with a Mo (92 weight percent)—Niobium (6 weight percent)—Tantalum (2 weight percent) alloy layer of 20 nm deposited over a 250 nm thick aluminum layer, after etching in a mixture of phosphoric acid, acetic acid, nitric acid, and de-ionized water.

After etching a Mo—Nb—Ta alloy layer an Aluminum layer, the structure may be generally free of an undercut, such as illustrated in FIGS. 14, 15, and 16.

Test Methods

Film deposition.

The substrate is a glass substrate or a silicon substrate (100). The substrate is cleaned using 96% sulfuric acid (4% water) and 30% hydrogen peroxide (70% water) at a ratio of 2:1. The silicon substrate is spun-dried with a rinse in deionized water for 150 seconds and a dry in nitrogen for 300 seconds. The glass substrate is blown dried. A film is deposited on the substrate using a sputtering deposition chamber and a sputtering target selected to produce the desired film. Unless otherwise specified, the sputtering is performed using DC mode at 400 W, with a pressure of 2 mTorr, 5 mTorr, or 10 mTorr. The sputtering time is selected to result in a deposited film having a thickness of about 500 nm. For a sputtering target including Mo, Ta, and Nb, the sputtering time is about 4 minutes. The resulting specimen consists of the substrate and the deposited layer. The thickness of the deposited layer is measured.

Etch Rate Measurement

Etching rate is measured on a film deposited on a substrate.

The specimen is etched in an etchant solution at 20 to 50° C., with the etchant being stirred.

The phosphoric acid/acetic acid/nitric acid (PAN) etchant solutions used in etching the films are listed in Table 1.

TABLE 1

Compositions of PAN Etchants

| Etchant Composition | Phosphoric Acid, weight percent | Acetic Acid, weight percent | Nitric Acid, weight percent | De-ionized Water, weight percent |
|---|---|---|---|---|
| PAN-1 | 65 | 10.0 | 1.0 | 24 |
| PAN-2 | 65 | 10.0 | 3.0 | 22 |
| PAN-3 | 65 | 10.0 | 5.0 | 20 |
| PAN-4 | 72.9 | 4.7 | 1.4 | 21.0 |
| PAN-5 | 70 | 10 | 2.5 | 17.5 |

Method 1—Single film etching test. A single film is deposited on the substrate. The film is submerged in the etchant while agitating the solution with a stir bar or other stirring implement. The time for removal of the deposited layer is measured and the etching rate in units of nm/s is calculated.

Method 2—Multilayer film etching test. A Multilayer etching performance is measured using specimens including two or more deposited layers to be etched at the same time. The specimens are prepared as described above by depositing (e.g., by sputtering) a first layer on a substrate having a generally uniform thickness with an exposed surface perpendicular to the thickness. Then a second layer having is deposited having a generally uniform thickness and covering the entire exposed surface of the first layer. The specimen is treated using photolithography (e.g., using a photoresist, such as 1813 Shipley photoresist) to cover the surface of the second layer except for features having a diameter and/or width of about 100 µm. The specimen is etched using an etchant such as a solution described herein (e.g., with respect to measurement of the etching rate). Initially the etchant solution removes only material of the second layer in the regions of the feature. After a sufficient amount of the second layer is removed, the etchant solution begins to remove the first layer in the regions of the feature, while simultaneously laterally removing additional material of the second layer. The etching is continued for a sufficient time so that the substrate is exposed in the region of the features. After etching, the photoresist layer may be removed.

The time for removal of the deposited layer may be determined by changes in the color of the specimen when the layers and substrates have different colors as in examples described herein.

Adhesion

Adhesion is measured using an adhesion tape test according to ASTM B905-00, with tape designation D3359-08. Unless otherwise described, the measurements are performed on films deposited on both sides of the substrate, with a film thickness of about 200 nm. A rating of 5B indicates good adhesion and that the deposited layer is not removed by the tape.

Deposition Rate

Deposition rate is determined by measuring the thickness of the deposited layer (in units of nm) and dividing by the deposition time (in units of minutes). The thickness of the deposited layers is measured using a profilometer, such as a Zygo profilometer or a KLA-Tencor P-15 profilometer.

Layers are deposited using a magnetron sputter deposition system. A Perkin Elmer 2400 having a DC power supply is used. Unless otherwise specified, the silicon substrates are wafers having (100) orientation. The substrate is positioned about 3.25 inches from the sputtering target and a power of 400 W is employed.

Electrical Resistivity

The sheet resistance of the deposited films is measured using a four-point probe. Two samples are measured for each deposition condition. The resistivity is then calculated by the geometry of the test sample. For resistivity calculations, average thickness and average sheet resistance values (using the inner 1.5 inch area) are used. The sheet resistance is measured using a Jandel Eng. Serial 74378 four point probe.

The uniformity of the electrical resistivity is determined from 10 sheet resistance measurements taken within the central 1.5 inch diameter of a 3 inch diameter specimen. Each measurement is taken at a location at least about 0.5 inches from the other measurement locations. The uniformity is the ratio of the standard deviation of the electrical resistivity to the average electrical resistivity and is expressed in units of percent.

Corrosion Resistance

Corrosion resistance is measured on films deposited on a glass slide. The film thickness is at least about 300 nm. The sheet resistance is measured as described above after depositing the film. Then the film is exposed to a 80% or 90% relative humidity at 60° C. for an extended period of time. In one measure of corrosion resistance, the sheet resistance is measured after 4 weeks at 80% relative humidity/60° C., and the percent increase in the sheet resistance is calculated. Films having improved corrosion resistance generally have lower percent increase in sheet resistance. In a second measure of corrosion resistance, the film is exposed to 90% relative humidity/60° C. for 38 days and the sheet resistance is measured at least once every 7 days. The sheet resistance is plotted against the number of days exposure and a best fit line is determined. The slope of the line, in units of $\Omega/sq/day$ is the measure of corrosion resistance. Films having improved corrosion resistance generally have lower slopes.

The level of corrosion resistance can also be determined by visual observation of the film surface after exposure to temperature and humidity. The corroded regions of the film appear dark, in contrast with the shiny mirror and/or metallic appearance of the film as deposited. Image analysis techniques may be used to quantify the area that has been corroded.

Microstructure of Deposited Films

The microstructure of the deposited films is obtainable using scanning electron microscopy. A Carl Zess Supra 25 field emission electron microscope that can measure backscattered electrons and secondary electrons is used in the examples.

Microstructure of the Sputter Targets

The micostructure of the sputter targets is obtainable using scanning electron microscopy. An ASPEX Personal Scanning Electron Micrsoscope is employed. The working distance is about 20 mm and the acceleration voltage is about 20 keV. The secondary electron detector is Everhart-Thornley type. The images are also obtained of the backscattered electrons.

The electron microscope is also employed for characterizing the specimens after etching. Prior to observing the etched specimen any photoresist is removed using acetone. A magnification of about 50,000 to 150,000 is employed.

X-ray Diffraction Measurements

X-ray diffraction studies are performed using a Phillips X'Pert Pro X-ray diffractometer.

Optical Reflectance

The optical reflectance is calculated as the average reflectance in the wavelength range of 400 nm to 800 nm. A Varian Cary 100 Bio reflectometer is used for measuring the optical reflectance.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of the Invention of a range in terms of at "'x' parts by weight of the resulting polymeric blend composition" also contemplates a teaching of ranges of same recited amount of "x" in percent by weight of the resulting polymeric blend composition."

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

EXAMPLES

Example 1 is an aluminum sputtering target having an aluminum concentration of 99.99 weight percent or more. The aluminum target is commercially available from Plasmaterials.

Examples 2 through 9 are molybdenum containing sputtering targets. The molybdenum containing targets are prepared by powder metallurgy using blends of molybdenum powder and powders of any other metal in the target. The targets are prepared by cold isostactic pressing the powder blend to form a compacted mass and then hot isostatic pressing the compacted mass to form a densified target plate. The sputtering target is formed from the densified target plate and optionally includes one or more steps of rolling, one or more steps of annealing, one or more steps of cutting, or any combinations thereof. The compositions of the sputtering targets are shown in Table 2 below. Each sputtering target has a density of about 97 percent or more of theoretical density.

TABLE 1

Compositions of sputtering targets

| | Target | | | | | | | |
|---|---|---|---|---|---|---|---|---|
| | Example 2 | Example 3 | Example 4 | Example 5 | Example 6 | Example 7 | Example 8 | Example 9 |
| Description | Mo | Mo10Nb | Mo12Ta | Mo6Nb/3Ta | Mo6Nb | Mo5Nb/2Ta | Mo6Nb/2Ta | Mo8Nb/2Ta |
| Composition, weight percent | | | | | | | | |
| Molybdenum | 100 | 90.3 | 88.2 | 91 | 94 | 93 | 92 | 90 |
| Niobium | — | 9.7 | 11.8 | 6 | 6 | 5 | 6 | 8 |
| Tantalum | — | — | — | 3 | — | 2 | 2 | 2 |

For each sputtering target, (examples 1-9), etchant test specimen are prepared by sputtering a single layer of film onto one surface of about 25 mm×75 mm glass slide. The sputtering time is selected so that the deposited film has a thickness of 300 nm +/−10%. The thickness of the film is measured using KLA-Tencor P-15 profilometer. Prior to depositing the film, the glass slide is transparent. After depositing the film, the surface becomes a silver colored mirror. The glass slide is then divided into 3 test specimen, each having a dimension of about 25 mm×25 mm. Each deposited layer has about the same composition as the sputtering target from which it is deposited.

The etching time is determined by etching the 25 mm×25 mm glass slide specimen with the deposited film in etchant solution. The etchant solutions were prepared by mixing phosphoric acid, acetic acid, nitric acid and de-ionized water. Five different phosphoric acid/acetic acid/nitric acid (PAN) etchants were prepared with the compositions listed in Table 1 as PAN-1, PAN-2, PAN-3, PAN-4, and PAN-5. These etchants have total concentration of phosphoric acid+acetic acid+nitric acid from 74 weight percent to 82.5 weight percent. Etching is performed at one of the following test temperatures: 20° C., 42° C., or 50° C. as indicated in Table 3. About 110-150 ml of etchant solution is placed in a beaker and heated to the test temperature while stirring the solution. The 25 mm×25 glass slide specimen is submerged in the etchant solution. The time for the glass slide specimen to become transparent is measured as the etch time. The stirring and heating of the solution is maintained throughout the etching. The etch rate is calculated as follows: etch rate (nm/sec)=film thickness (nm)/etch time (sec). For each etchant solution, the etch rate of an aluminum film is also measured at the same test temperature. The etch rate ratio is calculated as follows:

ERR=etch rate of molybdenum containing film/etch rate of aluminum film;

where the molybdenum containing film and aluminum films are etched at the same temperature and in the same etchant solution. An etch rate ratio of 1 indicates that the molybdenum containing film and the aluminum film etch at the same rate. An etch rate ratio of greater than 1 indicates that the molybdenum containing film etches faster than the aluminum film. An etch rate ratio of less than 1 indicates that the molybdenum containing film etches slower than the aluminum film.

The etch rate ratios for the deposited films of molybdenum containing targets Examples 2 through 9 (relative to the etch rate of aluminum) is listed in Table 3. The left column in Table 3 identifies the PAN etchant and the test temperature.

Other properties of deposited films from molybdenum containing targets are shown in Table 4.

15 weight percent de-ionized water. The resulting structure after removing the photoresist layer is shown in FIG. 11A. In Example 10B, the PAN etchant includes 70 weight percent phosphoric acid, 10 weight percent acetic acid, 7 weight percent nitric acid, and 13 weight percent de-ionized water. The resulting structure after removing the photoresist layer is shown in FIG. 11B.

Example 11

Multi-layered specimens are prepared by depositing a 250 nm layer of aluminum onto a glass substrate and then depositing a 20 nm Mo—Nb—Ta layer over the aluminum layer by sputtering the Mo5Nb2Ta target of Example 7. Photolithography is used to prepare an etch pattern for selectively etching the multi-layered specimen with a PAN etchant. The PAN etchant includes 70 weight percent phosphoric acid, 10 weight percent acetic acid, 2 weight percent

TABLE 3

Etch rate ratios in different etchants and at different temperatures

| | Target | | | | | | | |
|---|---|---|---|---|---|---|---|---|
| | Example 2 | Example 3 | Example 4 | Example 5 | Example 6 | Example 7 | Example 8 | Example 9 |
| | | | | Description | | | | |
| | Mo | Mo10Nb | Mo12Ta | Mo6Nb/3Ta | Mo6Nb | Mo5Nb/2Ta | Mo6Nb/2Ta | Mo8Nb/2Ta |

Etching results: Etch rate ratio = Etch rate of example/etch rate of aluminum (in same etchant)

| Etchant/Temperature (° C.) | | | | | | | | |
|---|---|---|---|---|---|---|---|---|
| PAN-1/42 | | | | 1.35 | | | | |
| PAN-2/42 | | | | 1.40 | | | | |
| PAN-3/42 | 5.05 | 0.45 | 0.51 | 0.82 | | | | |
| PAN-4/42 | 0.96 | 0.60 | 0.67 | 0.95 | | | | |
| PAN-5/42 | | 0.69 | | 1.04 | 1.65 | 1.58 | 1.25 | 0.74 |
| PAN-5/20 | | 0.67 | | 0.88 | 1.33 | 1.48 | 1.10 | 0.72 |
| PAN-5/50 | | 0.85 | | 1.19 | 1.48 | 1.22 | 1.23 | 0.87 |

TABLE 4

Properties of deposited films

| | Mo6Nb6Ta | Mo3Nb6Ta | Mo10Nb | Mo11Ta | Mo3Nb6Ta |
|---|---|---|---|---|---|
| Electrical resistivity, μΩcm (film thickness ≈ 200 nm) | 17 | 20 | 16 | 20 | 14 |
| Adhesion on glass | 4B, 5B, 5B | 4B, 2B, 4B | 2B, 5B, 5B | 5B, 2B, 5B | 3B, 4B, 5B |
| Adhesion on silicon | 5B, 5B, 5B | 5B, 5B, 5B | 5B, 5B, 5B | 3B, 0B, 2B | 5B, 5B, 5B |
| Uniformity, % | 4.4 | 5.6 | 4 | 5 | 4 |
| Reflectivity at 400-800 nm, % | 81 | 62 | 61 | 65 | 67 |
| Grain size, nm | 27, 34, 32 | 23, 32, 46 | 22, 27, 29 | 21, 22, 20 | 24, 28, 36 |

Example 10

A sputtering target (Mo6Nb6Ta) having about 88 weight percent molybdenum, about 6 weight percent niobium, and about 6 weight percent tantalum is prepared by powder metallurgy methods as described herein. Multi-layered specimens are prepared by depositing a 250 nm layer of aluminum onto a glass substrate and then depositing a 50 nm Mo—Nb—Ta layer over the aluminum layer by sputtering the Mo6Nb6Ta target. Photolithography is used to prepare an etch pattern for selectively etching the multi-layered specimen with a PAN etchant. In Example 10A, the PAN etchant includes 70 weight percent phosphoric acid, 10 weight percent acetic acid, 5 weight percent nitric acid, and nitric acid, and 18 weight percent de-ionized water. The resulting structure after removing the photoresist layer is shown in FIG. 14.

Example 12

Multi-layered specimens are prepared by depositing a 250 nm layer of aluminum onto a glass substrate and then depositing a 20 nm Mo—Nb—Ta layer over the aluminum layer by sputtering the Mo6nb2Ta target of Example 8. Photolithography is used to prepare an etch pattern for selectively etching the multi-layered specimen with a PAN etchant. The PAN etchant includes 70 weight percent phosphoric acid, 10 weight percent acetic acid, 2 weight percent nitric acid, and 18 weight percent de-ionized water. The resulting structure after removing the photoresist layer is shown in FIG. 15.

Example 13

Multi-layered specimens are prepared by depositing a 250 nm layer of aluminum onto a glass substrate and then depositing a 20 nm Mo—Nb—Ta layer over the aluminum layer by sputtering the Mo6Nb3Ta target of Example 5. Photolithography is used to prepare an etch pattern for selectively etching the multi-layered specimen with a PAN etchant. The PAN etchant includes 70 weight percent phosphoric acid, 10 weight percent acetic acid, 2 weight percent nitric acid, and 18 weight percent de-ionized water. The resulting structure after removing the photoresist layer is shown in FIG. 16.

Example 14

Figure 17:
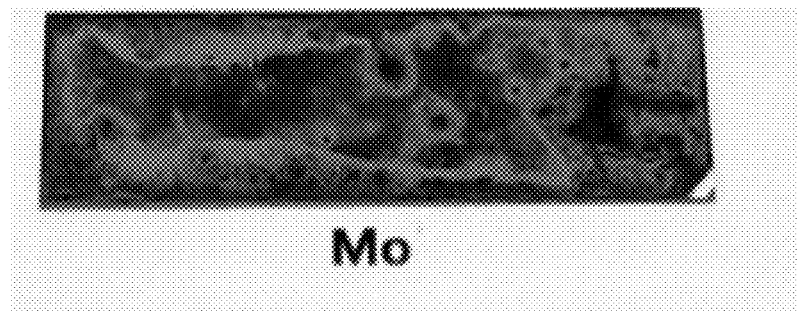
FIG. 17 illustrates the appearance and features of deposited films after exposure to 90% relative humidity/60° C. for 21 days. The molybdenum film shows the highest level of corrosion. The film of the molybdenum—niobium—tantalum alloy shows the lowest level of corrosion.
Figure 17:
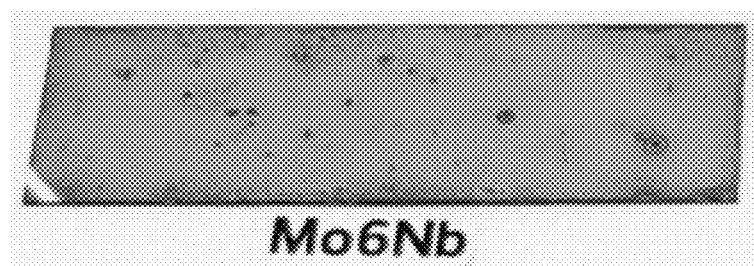
Figure 17:

The corrosion resistance of the various deposited layers is measured by first depositing a layer onto a glass slide and then exposing the glass slide to 60° C./90% relative humidity. The surface resistance is measured prior to exposure to the humidity, and then at least once every 7 days. The last measurement is after 38 days. In general, the surface resistance increases with exposure time. The molybdenum film had an initial thickness of about 500 nm and the alloy films each had an initial thickness of about 300 nm. The slope of the best fit line for the surface resistance v. days (of exposure to the humidity) is shown in Table 5. The surface resistance after 28 days is also shown in Table 5. Photographs of Example 2, Example 6, and Example 3 after 21 days exposure at 60° C./90% relative humidity is shown in FIG. 17. The film from Example 2 (Mo) has the highest level of corrosion, and the film from Example 5 (Mo6Nb3Ta) has the lowest level of corrosion.

after forming the metal layer, sputtering the sputtering target in a presence of oxygen to form an oxide layer over the alloy layer and the metal layer, wherein the oxide layer comprises molybdenum, niobium, tantalum, and oxygen, and wherein the alloy layer and the oxide layer have the same atomic ratio of Mo:Ta, Nb:Ta, and Mo:Nb; and with a PAN etchant comprising phosphoric acid, acetic acid, nitric acid, and water, etching away portions of the alloy layer, the metal layer, and the oxide layer.

2. The method of claim 1, wherein the sputtering target comprises about 0.7 atomic percent to about 4 atomic percent tantalum.

3. The method of claim 1, wherein the sputtering target comprises about 89 atomic percent to about 96 atomic percent molybdenum.

4. The method of claim 1, wherein the sputtering target comprises about 2.8 atomic percent to about 7.6 atomic percent niobium.

5. The method of claim 1, wherein the sputtering target comprises about 0.7 atomic percent to about 3.7 atomic percent tantalum.

6. The method of claim 1, wherein the total concentration of the molybdenum, the niobium, and tantalum atoms in the sputtering target is about 95 atomic percent or more.

7. The method of claim 1, wherein the total concentration of the molybdenum, the niobium, and tantalum atoms in the sputtering target is about 99.8 atomic percent or more.

8. The method of claim 1, wherein the metal layer comprises Al.

TABLE 5

Corrosion Resistance Measurement

| | Target | | | | | | |
|---|---|---|---|---|---|---|---|
| | Example 2 | Example 3 | Example 5 | Example 6 | Example 7 | Example 8 | Example 9 |
| | Description | | | | | | |
| | Mo | Mo10Nb | Mo6Nb/3Ta | Mo6Nb | Mo5Nb/2Ta | Mo6Nb/2Ta | Mo8Nb/2Ta |
| Slope of surface resistance v. exposure days (mΩ/sq/day) | 1.11 | 0.28 | 0.14 | 0.34 | 0.29 | 0.20 | 0.15 |
| Initial surface resistance (Ω/sq) | 0.280 | 0.615 | 0.535 | 0.496 | 0488 | 0.500 | 0.512 |
| Percent increase in surface resistance after 28 days (%) | 9.1 | 1.5 | 0.8 | 1.2 | 1.8 | 1.1 | 0.9 |

What is claimed is:

1. A method of fabricating an electronic device, the method comprising:
   sputtering a sputtering target to form an alloy layer over a substrate, wherein (a) the sputtering target comprises (i) about 88 atomic percent to about 97 atomic percent molybdenum, (ii) about 2 atomic percent to about 8 atomic percent niobium, and (iii) about 0.5 atomic percent to about 5 atomic percent tantalum, and (b) the alloy layer comprises molybdenum, niobium, and tantalum;
   forming a metal layer over the alloy layer, wherein the metal layer comprises at least one of Al, Fe, Cu, Ag, Au, W, Zn, Pt, or Sn;

9. The method of claim 1, wherein the substrate comprises glass or silicon.

10. The method of claim 1, wherein etching away the portion of the oxide layer and the portion of the alloy layer thereunder comprises etching away the portion of the oxide layer and the portion of the alloy layer thereunder with the PAN etchant in a single etch step.

11. The method of claim 1, further comprising:
   forming an input component over the substrate, the input component comprising a plurality of touch sensors; and
   forming a transparent cover over the input component.

* * * * *